United States Patent
Bankuti et al.

(10) Patent No.: US 6,420,762 B1
(45) Date of Patent: *Jul. 16, 2002

(54) INTEGRATED ELECTROSTATIC PROTECTIVE RESISTOR FOR METAL OXIDE SEMICONDUCTOR FIELD EFFECT TRANSISTORS (MOSFETS)

(76) Inventors: Vilmos Bankuti, P.O. Box 853, Somers, CT (US) 06071; Alan Chagnon, 39 Woody Brook Rd., Windsor, CT (US) 06095

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 874 days.

(21) Appl. No.: 08/562,988
(22) Filed: Apr. 11, 1996
(51) Int. Cl.[7] ................................. H01L 23/62
(52) U.S. Cl. ........................................ 257/363; 257/355
(58) Field of Search ................................. 257/362, 355, 257/363, 356

(56) References Cited

U.S. PATENT DOCUMENTS

| 4,963,970 A | * | 10/1990 | Throngnumchai et al. .. 257/355 |
| 5,087,955 A | * | 2/1992 | Futami ........................ 257/355 |
| 5,528,064 A | * | 6/1996 | Thiel et al. .................. 257/362 |

FOREIGN PATENT DOCUMENTS

EP 0372820 * 6/1990 ................. 257/356

* cited by examiner

*Primary Examiner*—Roy Potter
(74) *Attorney, Agent, or Firm*—Cantor Colburn LLP

(57) ABSTRACT

A resistor or resistance (5) connected between the Gate (3) and Source (1) nodes within any package (4) containing one or more MOSFETs.

5 Claims, 1 Drawing Sheet

Figure 1:
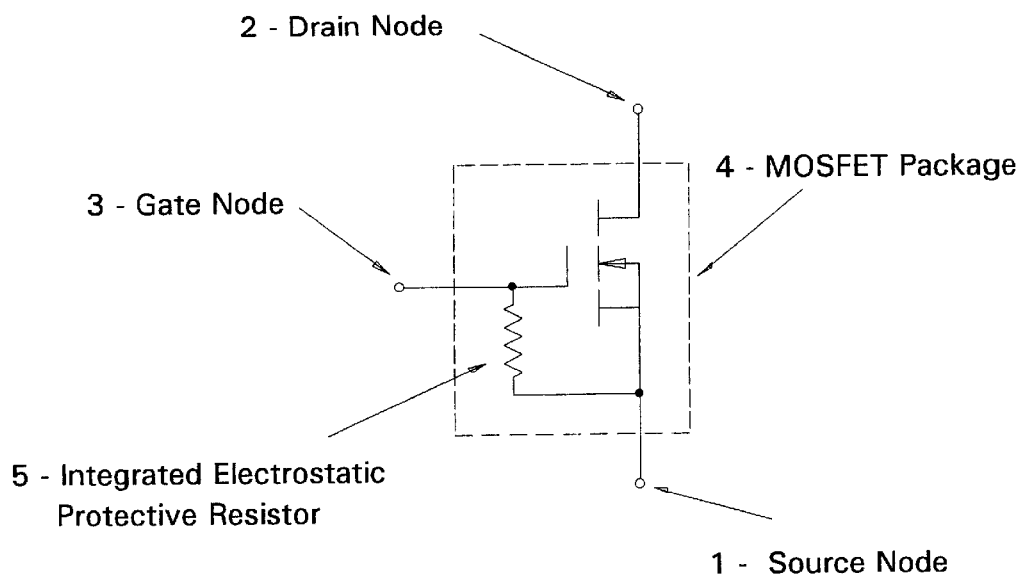

INTEGRATED ELECTROSTATIC PROTECTIVE RESISTOR FOR METAL OXIDE SEMICONDUCTOR FIELD EFFECT TRANSISTORS (MOSFETS)

BACKGROUND

1. Field of Invention

Metal Oxide Semiconductor Field Effect Transistors (MOSFETs) are used in a variety of applications. Currently expensive measures needed to handle MOSFETs properly to safeguard against damage due to electrostatic build up and discharge. The invention pertains to a resistor electrically connected to the Gate and Source nodes of any MOSFET within the MOSFET package.

2. Description of Prior Art

We are not aware of any MOSFETs that incorporate an Electrostatic Protective Resistor within the MOSFET package.

Objects and Advantages

The purpose of our invention is to make the MOSFET electrostatically protected and in turn more reliable. It eliminates the need for electrostatic handling and packaging precautions which would save the electronics industry millions of dollars. Savings would be seen through the elimination of present training and equipment needed to provide the protection.

DRAWING FIGURES

FIG. 1 shows an N-Channel, enhancement mode MOSFET (a typical application) with the Electrostatic Protective Resistor within the MOSFET Package.

REFERENCE NUMERALS IN DRAWING

1 Source Node
2 Drain Node
3 Gate Node
4 MOSFET Package
5 Integrated Electrostatic Protective Resistor

Description—FIG. 1

FIG. 1 illustrates a typical application. The Electrostatic Protective Resistor is electrically connected to the Gate 3 and Source 1 nodes of any Metal Oxide Semiconductor Field Effect Transistor (MOSFET) within the MOSFET package 4. The resistor can be implemented as part of the Monolithic Process during the fabrication of the MOSFET itself. Also it can be implemented through Thin Film Technology, Thick Film Technology and in the case of a Chip Resistor, Hybrid Technology.

Operation—FIG. 1

Both N-channel and P-channel MOSFET devices exhibit very large resistances between their Gate and Source nodes (in excess of one thousand Mega Ohm). This resistance is referred to as the Gate-Source Static Resistance or the Static Input Resistance of the MOSFET. The metal oxide insulation between the Gate and Source for practical devices is very thin, therefore having only a very low dielectric strength (typically +/−20VDC). The Gate, the Source and the metal oxide insulation between them, form a capacitance, which is called the Gate-Source Capacitance. This capacitor can reach a value up to several thousand picofarads (pF).

Electrostatic build up in general, can charge up any capacitor with high insulation resistance to a very high DC voltage (thousands of volts). If the Gate 3 and Source 1 electrodes of a MOSFET are not connected to an external circuit capable of limiting the electrostatic build up, the subsequent charge can create a DC voltage that can exceed the dielectric strength of the metal oxide layer. In turn, dielectric breakdown occurs leading to a discharge through the dielectric material. The discharge current can momentarily generate local temperatures high enough to permanently damage the metal oxide layer, rendering the MOSFET inoperative. Notice, that for clarity, FIG. 1 does not show the Gate-Source Static Resistance, or the Gate-Source Capacitance. FIG. 1 only shows the Integrated Electrostatic Protective Resistor. The Integrated Electrostatic Protective Resistor 5 provides continuous discharge of voltage accumulated on the Gate-Source capacitance.

Summary, Ramification, and Scope

The extremely high Input Resistance of the MOSFET would effectively be reduced. The high Input Resistance is utilized mainly in low power, small signal applications. In power MOSFET applications however, the high Input Resistance is not needed.

This invention will allow but is not limited to power MOSFETs to have built in protection against damage incurred from electrostatic build up and discharge.

We claim:

1. An electrically protected MOSFET package consisting of:
   a MOSFET device having a gate node, a source node and a drain node; and
   a resistance connected between the gate node and the source node.

2. The MOSFET package of claim 1 wherein said resistance is a resistor.

3. The MOSFET package of claim 2 wherein the resistor has a first terminal and a second terminal, said first terminal being connected directly to the gate node and said second terminal being connected directly to the source node.

4. The MOSFET package of claim 1 wherein said resistance provides continuous discharge of voltage accumulated on a gate-source capacitance.

5. The MOSFET package of claim 1 wherein said MOSFET device is a power MOSFET device.

* * * * *

UNITED STATES PATENT AND TRADEMARK OFFICE
Certificate

Patent No. 6,420,762                                                      Patented: July 16, 2002

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Vilmos Bnakuti, Somers, CT.

Signed and Sealed this Seventeenth Day of December 2002.

CARL WHITEHEAD, JR.
*Supervisory Patent Examiner*
Art Unit 2822